US007246328B2

(12) United States Patent
Boose et al.

(10) Patent No.: US 7,246,328 B2
(45) Date of Patent: Jul. 17, 2007

(54) METHOD, COMPUTER PROGRAM PRODUCT, AND SYSTEM FOR PERFORMING AUTOMATED LINKING BETWEEN SHEETS OF A DRAWING SET

(75) Inventors: Molly L. Boose, Bellevue, WA (US); Lawrence S. Baum, Bellevue, WA (US); John H. Boose, Bellevue, WA (US); Carey Chaplin, Seattle, WA (US)

(73) Assignee: The Boeing Company, Seattle, WA (US)

( * ) Notice: Subject to any disclaimer, the term of this patent is extended or adjusted under 35 U.S.C. 154(b) by 518 days.

(21) Appl. No.: 09/971,283

(22) Filed: Oct. 4, 2001

(65) Prior Publication Data

US 2003/0025734 A1 Feb. 6, 2003

Related U.S. Application Data

(60) Provisional application No. 60/280,338, filed on Mar. 29, 2001.

(51) Int. Cl.
*G06F 3/00* (2006.01)
*G06F 9/00* (2006.01)
*G06F 17/00* (2006.01)

(52) U.S. Cl. .................. 715/805; 716/11; 715/804; 715/817; 715/818; 715/819

(58) Field of Classification Search .................. 370/83, 370/86; 345/765, 764, 771, 744; 716/11, 716/18
See application file for complete search history.

(56) References Cited

U.S. PATENT DOCUMENTS 5,386,508 A    1/1995  Itonori et al.
5,530,643 A *  6/1996  Hodorowski .................. 700/86
5,568,397 A * 10/1996  Yamashita et al. ............ 716/11
5,623,679 A    4/1997  Rivette et al.
5,742,504 A *  4/1998  Meyer et al. .................. 700/83
5,761,328 A    6/1998  Solberg et al.
5,867,596 A    2/1999  Kano et al.
5,895,473 A    4/1999  Williard et al.
6,044,211 A *  3/2000  Jain ........................... 716/18
6,110,223 A *  8/2000  Southgate et al. ............ 716/18
6,134,338 A   10/2000  Solberg et al.
6,701,508 B1 * 3/2004  Bartz et al. ................... 716/11

OTHER PUBLICATIONS

Special Edition Usin AutoCAD 2000.*

* cited by examiner

*Primary Examiner*—Kristine Kincaid
*Assistant Examiner*—Boris Pesin
(74) *Attorney, Agent, or Firm*—Alston & Bird LLP

(57) ABSTRACT

A method, computer program product and system are provided for performing automated linking between sheets of a drawing set depicting an electronic representation of an electrical wiring diagram. The method, computer program product, and system automatically transform drawings into a format that provides enriched electronic display and navigation among drawings. Connections and relationships among large sets of drawings are automatically discovered and extracted by utilizing complex graphical recognition and logical inference. Links are then created that represent the connections and relationships between common elements of the drawings. As such, the present invention automatically produces an interactive electronic representation of a drawing set that allows a user to quickly and accurately view, highlight and/or alter a portion of a drawing and all of the drawings that connect to or also depict that portion.

36 Claims, 10 Drawing Sheets

METHOD, COMPUTER PROGRAM PRODUCT, AND SYSTEM FOR PERFORMING AUTOMATED LINKING BETWEEN SHEETS OF A DRAWING SET

CROSS-REFERENCE TO RELATED APPLICATIONS

This application claims priority from a provisional patent application Ser. No. 60/280,338, filed Mar. 29, 2001, the contents of which are incorporated by reference in their entirety.

FIELD OF THE INVENTION

This invention relates to electronic graphics linking and, more particularly, to a method, computer program product and system that provide automated transformation of separate graphics into an enriched electronic display permitting efficient navigation among graphics.

BACKGROUND OF THE INVENTION

Complex illustrations of large structures or intricate arrangements, such as electrical wiring diagrams, are commonly depicted in a hard copy form consisting of multiple pages of drawings. Alternatively, the separate drawings may be depicted in electronic form. The drawings contain large amounts of information regarding each element of the drawing and the connections and relationships among the elements and among the set of drawings. Some of the information contained in the drawings is explicit, such as labels or other text. Other sources of drawing information are implicit, such as the symbols or configurations.

When a user needs information concerning a relatively small part of the structure or arrangement depicted in the set of drawings, the user must manually search through each page of the large sets of drawings, either on paper or on-line. For example, in industries that depend on complex technical drawings, manuals and parts catalogs for information about its systems, users must manually search many drawings before they can perform maintenance or troubleshoot the system. This typically becomes a lengthy process because the user must study the drawings to determine the way in which the drawings relate to each other and ensure he has all the drawings concerning the particular part of the system at issue. For instance, a wire or circuit from one drawing may be continued on one or more of the other drawings in the set. Similarly, the same circuit breaker may appear on several drawings, implying that wires connected to the circuit breaker on each drawing form a continuous circuit across the drawings. In addition to searching the drawing sets, the user also may have to refer to large parts catalogs or other manuals for more information about a certain element represented in the drawings. Searching the hard copies of the parts catalogs and/or manuals is tedious and time-consuming because of the massive amounts of information they contain. Even if the drawing sets, parts catalogs and/or manuals are on-line, the user nevertheless must repeatedly "pan" and "zoom" to find the exact information that they need.

Once users collect all of the drawings necessary to provide a comprehensive view of the system upon which they plan to work, they must carry the drawings, catalogs and/or manuals with them to perform the work. Otherwise, the user runs the risk of having to repeatedly return to the central repository of the drawings, catalogs and manuals. If the user realizes he needs drawings of another part of the system while working, then he must again commence the lengthy searches described above. In addition, if the tasks the user performs upon the system require the user to change the system in any way, then the user must manually annotate and mark up all the drawings to reflect the change. The users often keep the marked-up drawings for future reference, but the marked-up drawings become out-of-date with the next drawing revision if the annotations are not provided to the draftsperson and included in the revisions.

As the above discussion illustrates, the process of manually locating and attaining specific drawings from a large set of drawings for a complex structure or intricate arrangement, such as an electrical wiring diagram, is a daunting task, even for an experienced user. The process gets much more complicated when the user must also obtain all the drawings connected or related to a respective portion of the drawings at issue and/or all the information regarding particular elements within the drawings that is provided by part catalogs or other manuals. For example, finding each occurrence of a particular part number, detail label or text that appears on more than one sheet generally becomes a very lengthy process. Thus, manually searching large sets of drawings for particular parts of a system and obtaining all the drawings and/or information related to that part, is an inefficient, error-prone and expensive endeavor.

The conventional approach to providing users with faster and more accurate access to information contained in large sets of drawings is based upon manually inserting links and supporting information into an electronic drawing. The conventional approach to electronic graphic linking begins with converting all legacy electronic or hard copy drawings to an electronic format that will allow the drawing to be interactive, such as a computer graphics metafile (CGM) format. Once the drawings are formatted, the system builder manually re-authors the data in the drawings. To manually re-author the data, the system builder must examine each electronic drawing and manually create hundreds of individual selection device sensitive areas ("hotspots") for each drawing. The multitude of hotspots contain the specific drawing's information and all the links and relations to other drawings. The system builder also must create programs to instruct the system on what to do when the user points at or clicks on each hotspot with his selection device, such as a mouse. This approach eventually creates a system for providing users with fast access to information contained in large sets of drawings, such that the user can use a selection device, such as a mouse, to point and click on an electronic drawing to access information regarding a particular element of the drawing or connect to a related drawing. Unfortunately, this approach is also inefficient, error-prone and prohibitively expensive because of the significant amount of manual labor required to re-author the drawings. Thus, electronic information system builders often resist re-authoring a set of drawings even though the resulting drawings would provide users with fast and accurate access to information contained in large sets of drawings, parts catalogs and/or manuals.

For the reasons discussed above, there exists a need for a system that processes complex graphic files to provide users with fast and accurate access to information contained in large sets of drawings, parts catalogs and/or manuals. More particularly, the need is for a system that efficiently creates the intelligent graphic linking between common elements depicted on different drawing sheets.

SUMMARY OF THE INVENTION

In accordance with this invention, a method, computer program product, and system for performing intelligent graphic automated linking are provided. The method, computer program product, and system automatically transform drawings into a format that provides enriched electronic display and navigation among drawings. Connections and relationships among large sets of drawings are automatically discovered and extracted by utilizing complex graphical recognition and logical inference. Links are then created that represent the connections and relationships between common elements of the drawings. As such, the present invention automatically produces an interactive electronic representation of a drawing set that allows a user to quickly and accurately view, highlight and/or alter a portion of a drawing and all of the drawings that connect to or also depict that portion. The present invention is advantageous because it does not require the user to manually search through large drawing sets. Moreover, the present invention does not require the system builder to manually re-author electronic drawing sets. Therefore, the present invention creates and performs intelligent graphic automated linking that completely avoids the time-consuming and expensive steps of the other approaches and, instead, provides an efficient and accurate approach to automatically linking and thereafter searching large drawing sets.

In one embodiment of the present invention, the method, computer program product, and system create links between an electronic representation of sheets of a drawing set depicting an electrical wiring diagram. To create the links, the sheets of the drawing set are automatically reviewed, which includes automatically recognizing all of the off-sheet references contained in the drawing sheets of the electrical wiring diagram. The off-sheet references indicate a continuation of a portion of the electrical wiring diagram on one drawing sheet to another drawing sheet. The drawing sheet under review is the source sheet and the drawing sheet identified by the off-sheet reference is the target sheet. Once the off-sheet references of an electronic representation of an electrical wiring diagram are automatically recognized, links are created that indicate that the respective portions of the electrical wiring diagram depicted by the source and target sheets are electrically connected. The automatic reviewing of the drawings and the automatic recognition of the off-sheet references preclude the tedious, time-consuming, and expensive re-authoring tasks for system builders who otherwise would have to manually enter all the links to other drawing sheets into each drawing sheet.

An embodiment of the present invention may also incorporate a list of symbols representing various forms of off-sheet references. Thus, when the electronic representation of the drawing sheets are automatically reviewed, the off-sheet references are automatically recognized by identifying at least one symbol on the drawing sheet that is also in the list. Once the off-sheet reference is recognized, the target sheet is also identified based upon the symbol. Links are then created and embedded within the electronic representation of the drawing sheets that indicate that the respective portions of the electrical wiring diagram depicted by the source and target sheets are electrically connected. This embodiment of the present invention further simplifies the tasks of a system builder because the various forms of off-sheet references are entered into the list only once and the system builder is then ensured that the symbol will consistently and automatically be recognized as an off-sheet reference. The method, computer program product, and system of the present invention also include embodiments that create links between an electronic representation of sheets of a drawing set depicting an electrical wiring diagram and an electronic representation of graphics and text of a parts catalog. To create the links, the sheets of the drawing set are automatically reviewed, which includes automatically recognizing the off-sheet references associated with a part depicted in the drawing sheets of the electrical wiring diagram. The off-sheet references indicate that the graphics and text associated with the same part is depicted in the electronic representation of the parts catalog. The drawing sheet under review is the source sheet and the drawing sheet identified by the off-sheet reference is the target sheet. Once the off-sheet references are automatically recognized, links are created that indicate that the part depicted in the source sheet is the same part depicted in the target sheet. The ability to directly link to the electronic representation of the parts catalog from the electrical wiring diagram eliminates the time-consuming process of manually looking up the correct parts catalog information for the specific part shown in the electrical wiring diagram.

In other embodiments of the present invention, the method, computer program product, and system provide for viewing an electronic representation of an electrical wiring diagram depicted by a drawing set. To view the electronically represented multiple drawing sheets depicting an electrical wiring diagram, electronic links are provided that indicate that respective portions of the electrical wiring diagram are electrically connected. When a drawing sheet is chosen, called the source sheet, and a link depicted by the source sheet is selected, at least a segment of the target sheet that is associated with the source sheet by the link is automatically identified and displayed. In automatically displaying at least a segment of the target sheet, the elements that are common to both the source and target sheets are represented in the same manner. Additionally, when automatically displaying the segment of the target sheet that is linked to the source sheet, the element common to both the source and target sheets may also be displayed as a magnified view of the electrical wiring diagram. A user interface allows the user to interact with the display, for example by moving a cursor about the display via a selection device, such as a mouse, to indicate portions of the electrical wiring diagram that are electrically connected and to indicate selection of a link on a source sheet. The links between the drawings and the automatic display of the linked segments of an electrical wiring diagram save large amounts of time and money for users who otherwise would have to manually search large drawing sets to find all the drawings representing parts of the electrical wiring diagram related or connected to the portion of the electrical wiring diagram at issue.

Another embodiment of the method, computer program product, and system of the present invention for viewing an electronic representation of an electrical wiring diagram may also provide for setting a state of an element of the electrical diagram in a display of the source sheet. The user interface allows the user to set the state of the element in the display by moving a cursor via a selection device, such as a mouse, and selecting the desired state of the element. If the element is common to both the source and target sheets and therefore is associated with a link, then the automatic display of the target sheet will depict the element in the same state as it was set in the source sheet. Allowing the user to set the state of the elements in the electrical wiring diagram through the user interface and automatically updating all the drawings that also depict that element ensures that the entire drawing set will consistently and accurately reflect the state of the elements of the electrical wiring diagram. This embodiment of the present invention not only avoids the risk that the user will not alter all the drawings to reflect the current state of the electrical wiring diagram, but also prevents users from keeping marked-up drawing sets for future reference that become out-of-date with the next drawing revision. This embodiment also eliminates the time-consuming task of manually searching for all the drawings that depict the changed element and altering those drawings.

Likewise, an embodiment of the method, computer program product, and system of the present invention also may provide for highlighting a selected element of the electrical wiring diagram in a display of a source sheet. The user interface allows the user to highlight an element in the display by moving a cursor via a selection device, such as a mouse, and selecting the desired the element. If the element is common to a pair of linked source and target sheets, then the display of the target sheet will depict similar highlighting of the element. Highlighting the selected element in the target sheets further clarifies the complicated drawings for the user by noticeably indicating where the selected element is located on the target sheets, further providing the user with a fast and accurate search of the electronic representation of the electrical wiring diagram.

The method, computer program product, and system of the present invention may also include embodiments for viewing an electronic representation of graphics and text of a parts catalog depicting the same parts depicted in the electronic representation of the electrical wiring diagram. The electronic representation of the wiring diagram provides links that indicate that respective portions of the electrical wiring diagram and the parts catalog depict the same parts. Therefore, a user may select a link associated with a part in the electrical wiring diagram (source sheet) and the present invention automatically displays the portion of the parts catalog (target sheet) depicting the same part.

Thus, the intelligent automated graphic linking method, computer program product, and system of the present invention provide for automatically creating links among large sets of drawing sheets that provide an electronic representation of an electrical wiring diagram. The links indicate that the respective portions of the electrical wiring diagram depicted by the source and target sheets are electrically connected and provide the user with navigation among the drawings by selecting links. In addition, the links may indicate that a part depicted in the electrical wiring diagram is also depicted in an electronic representation of a parts catalog. The present invention may also provide for setting the state of or highlighting an element of the electrical diagram in a source sheet and automatically changing the state of or highlighting that element in all the target sheets that depict that element. All of the features of the various embodiments of the present invention provide users and electronic graphic system builders with intelligent graphic automated linking that completely avoids the time-consuming and expensive steps of the other approaches and, instead, provides an efficient and accurate approach to searching large drawing sets.

BRIEF DESCRIPTION OF THE DRAWINGS

Figure 1:
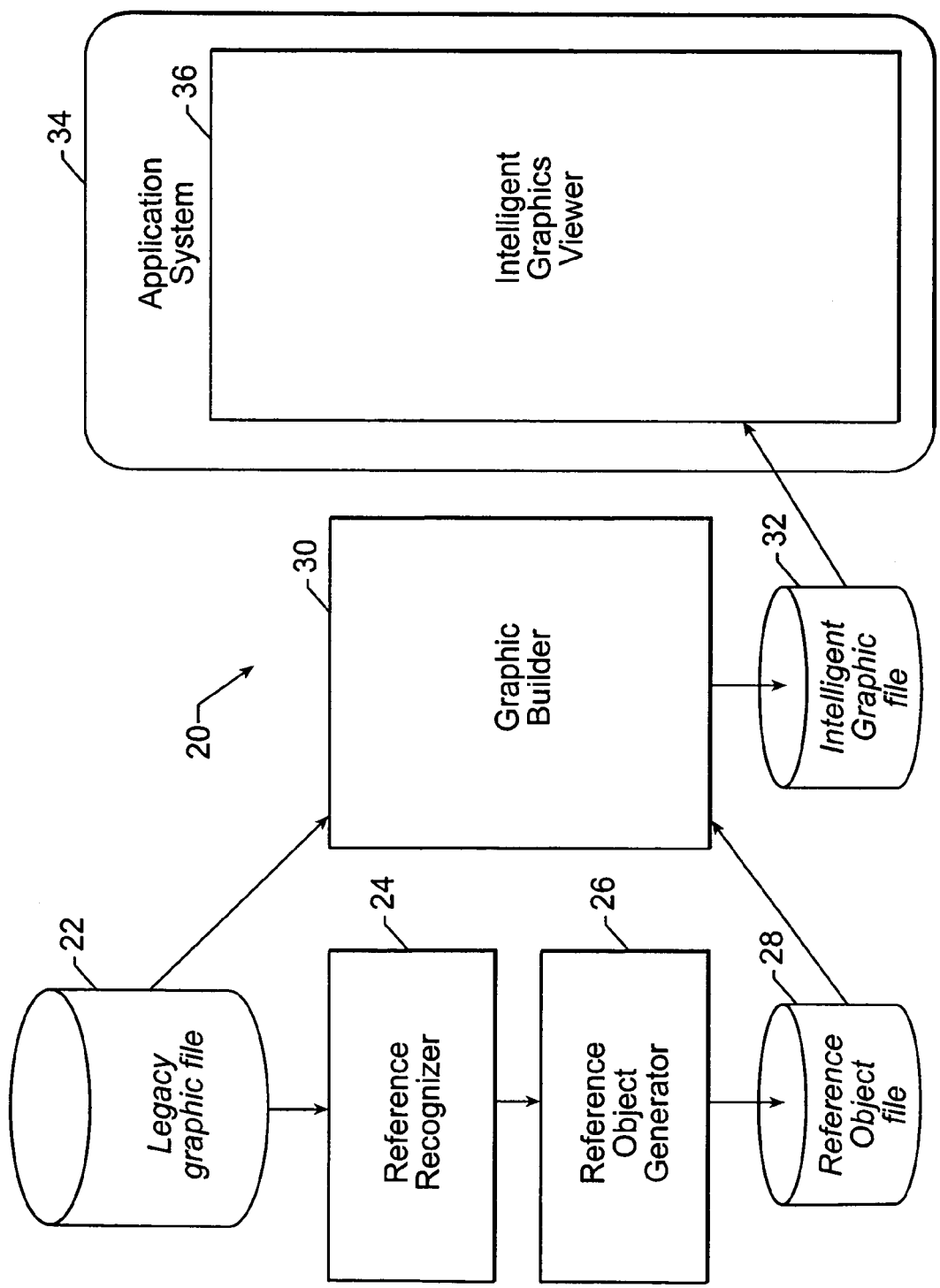
Figure 2:
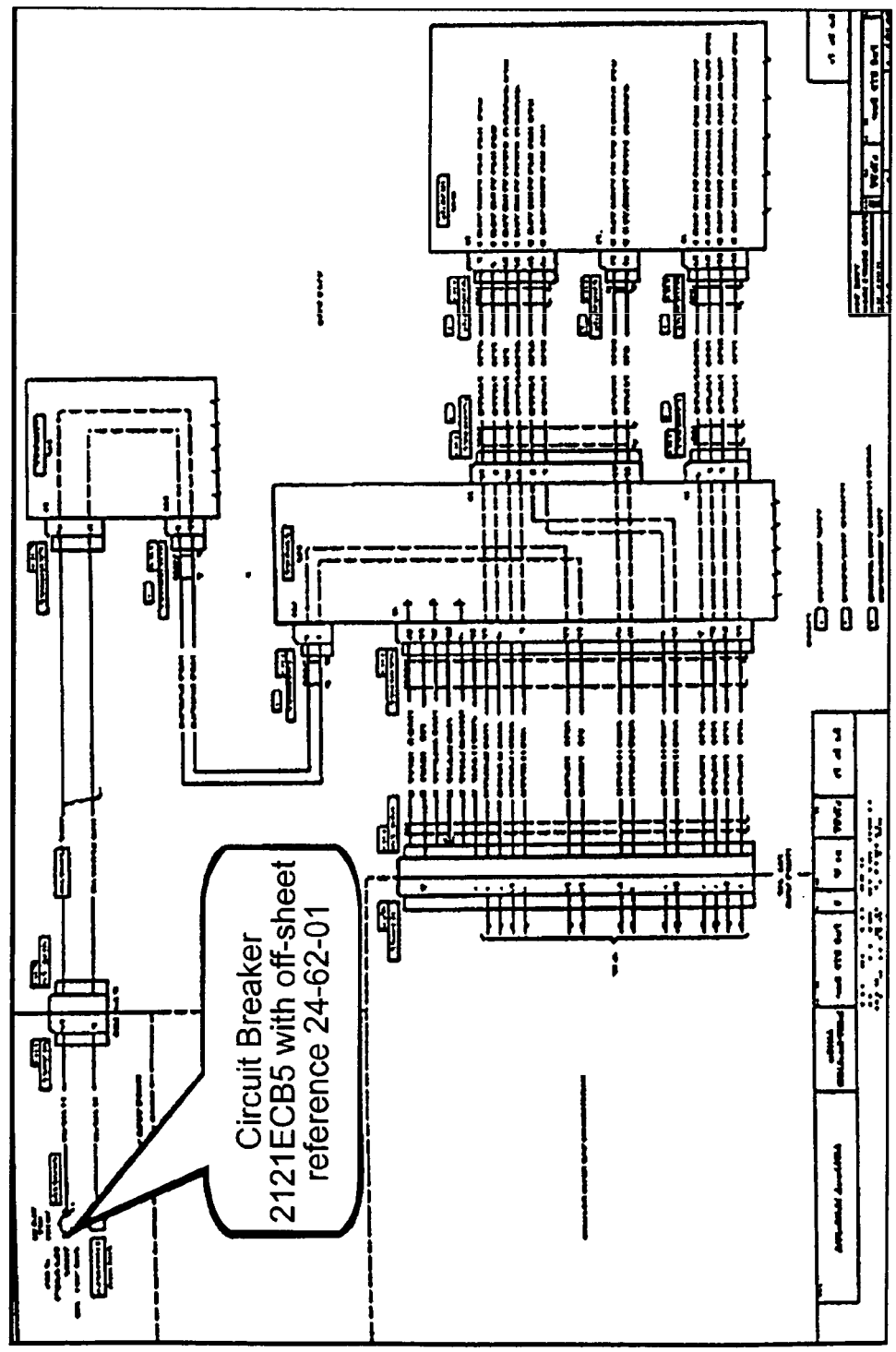
Figure 3:
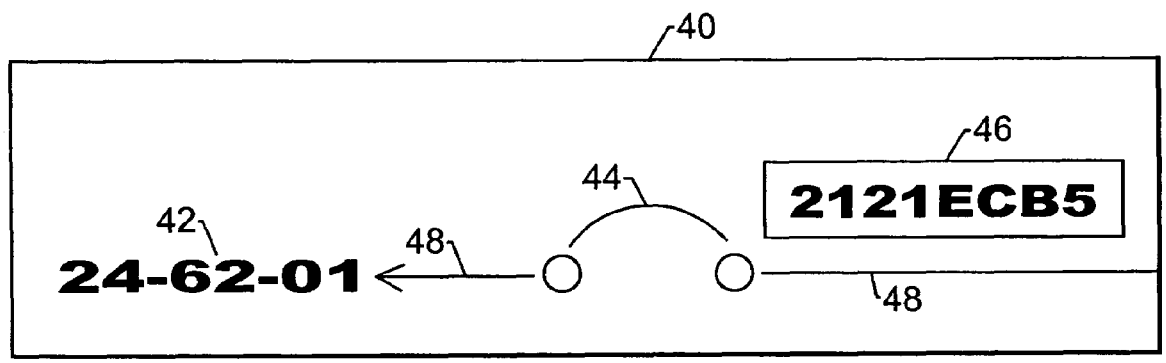
Figure 4:
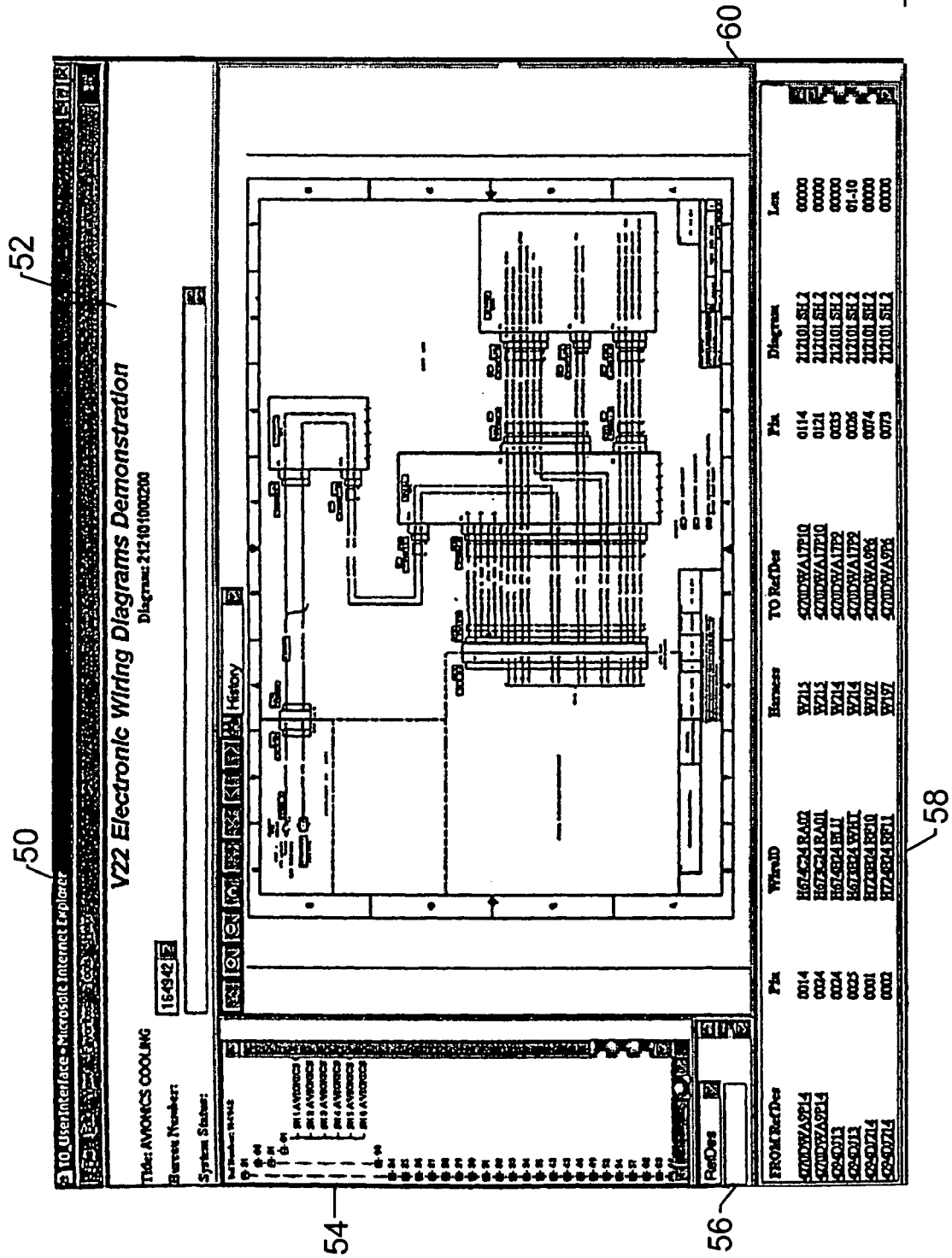
Figure 5:
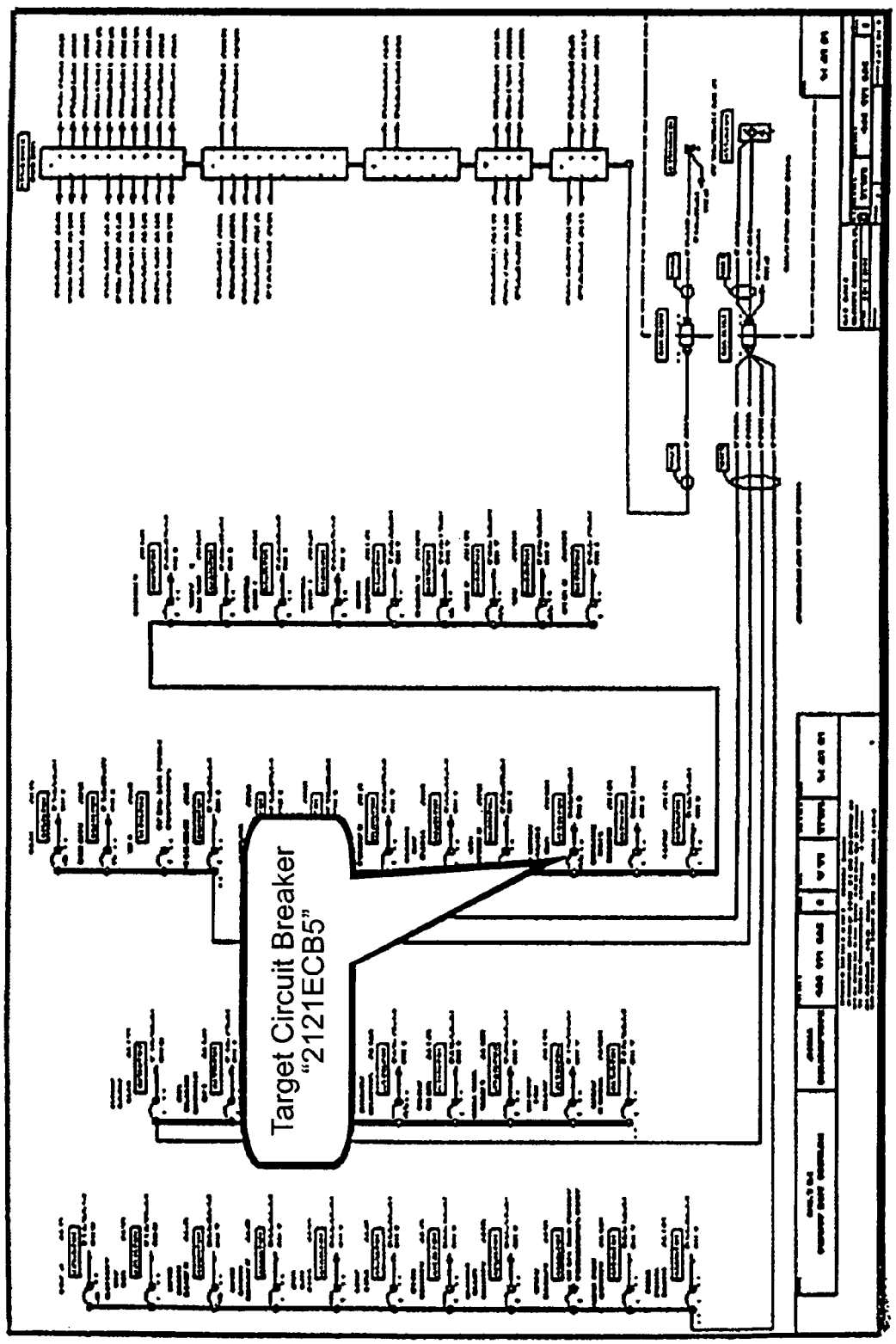
Figure 6:
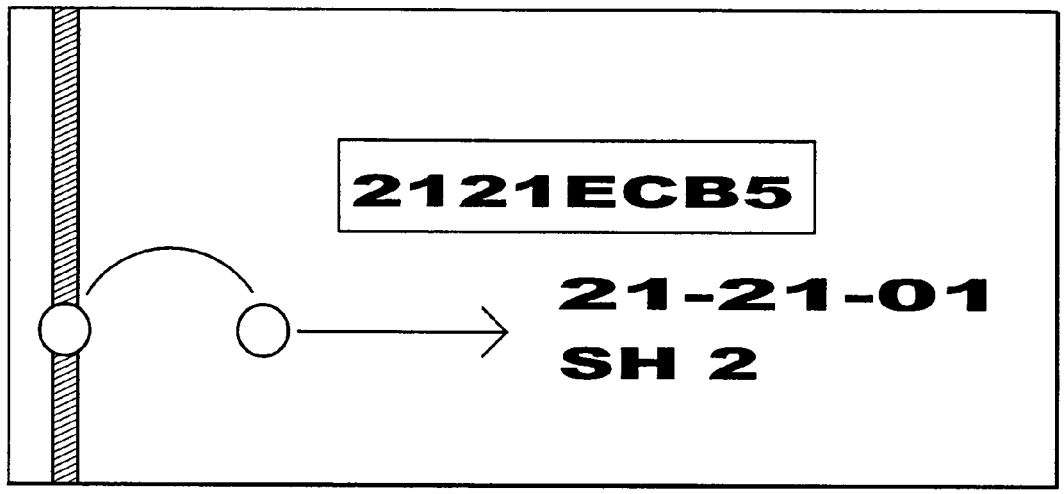
Figure 7:
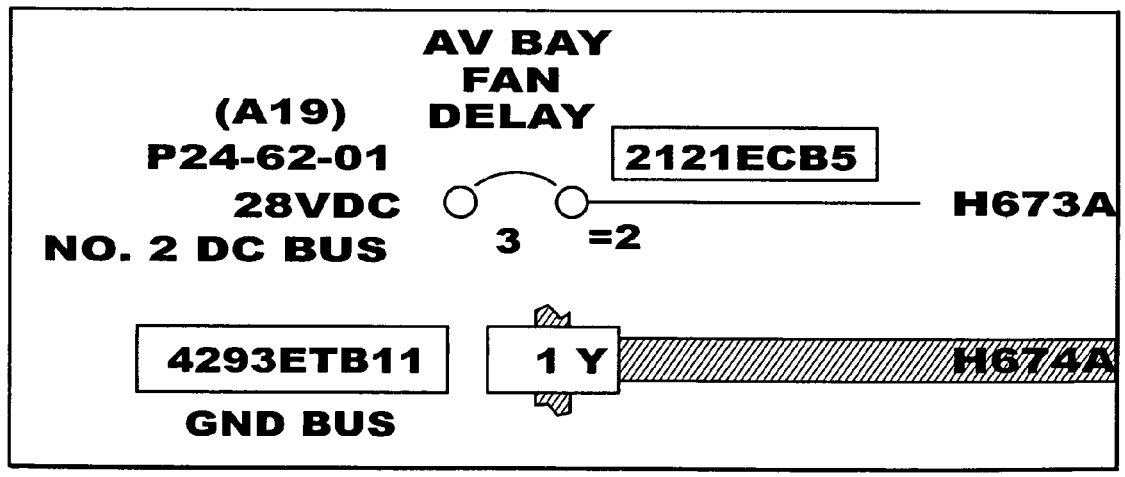
Figure 8:
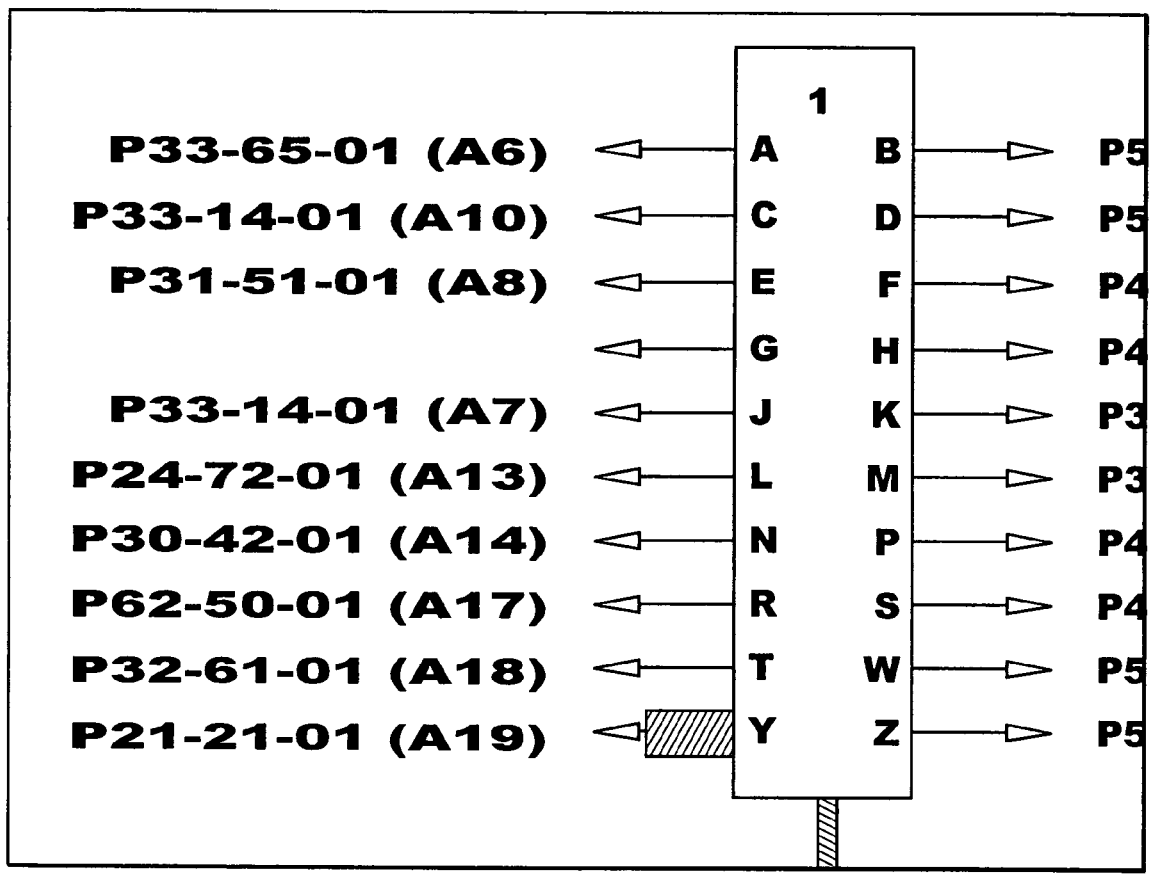
Figure 9:
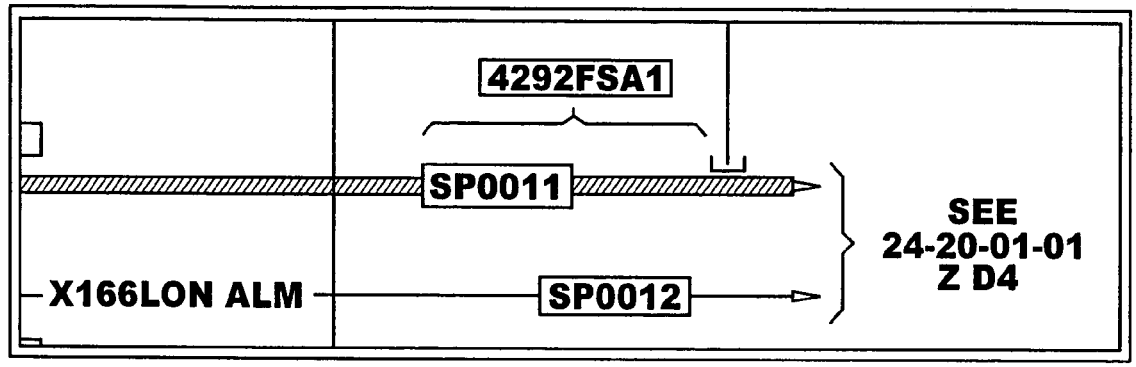
Figure 10:
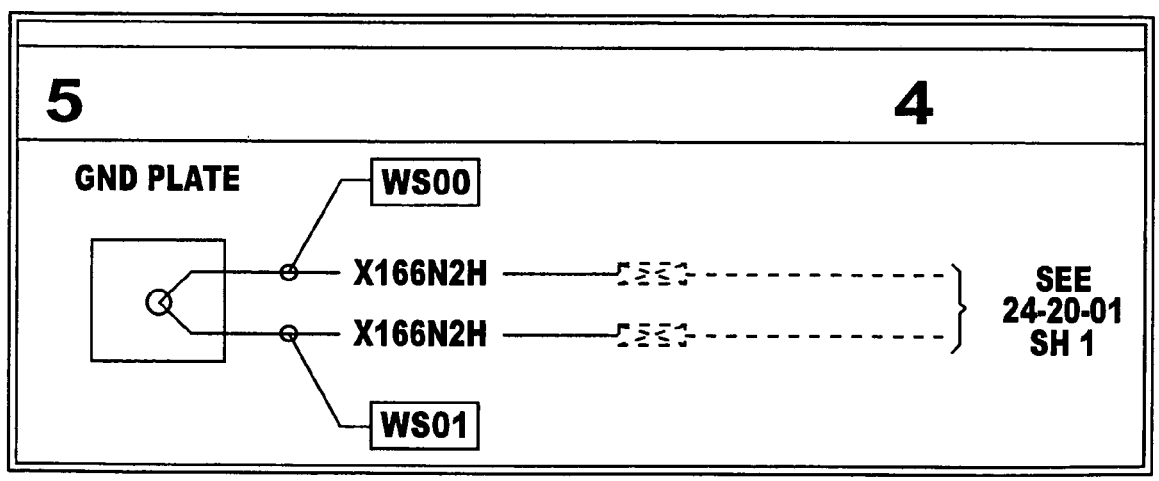
Figure 11:
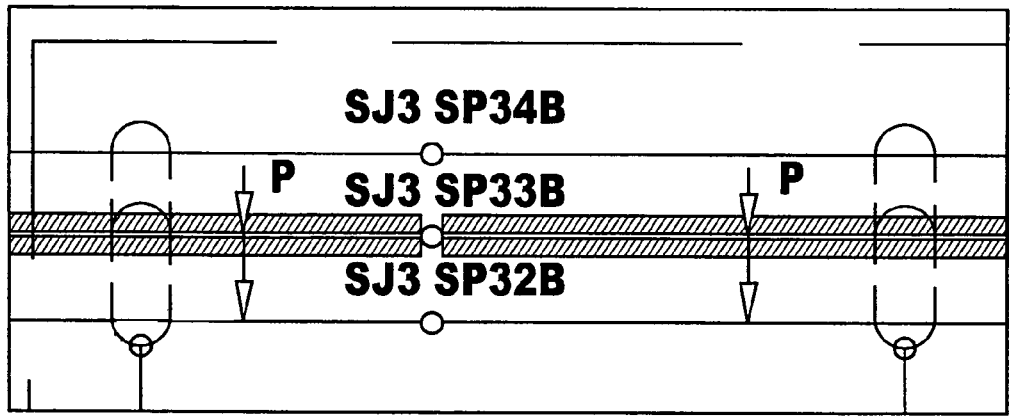
Figure 12:
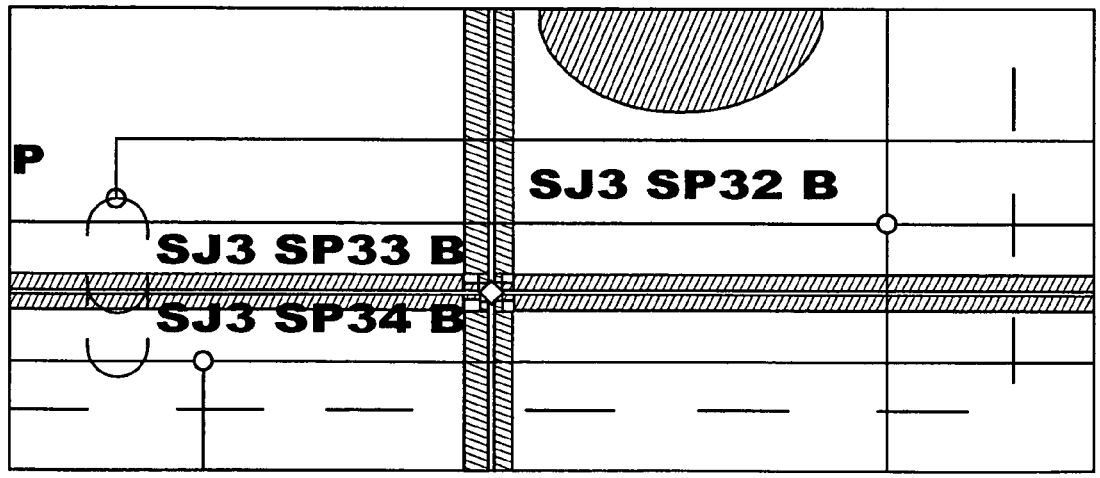
Figure 13:
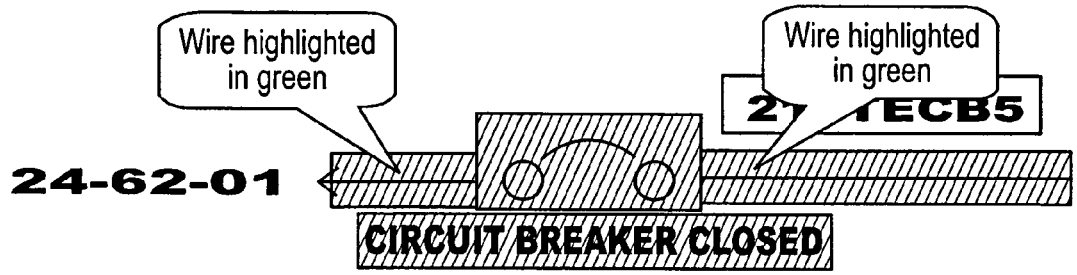
Figure 14:
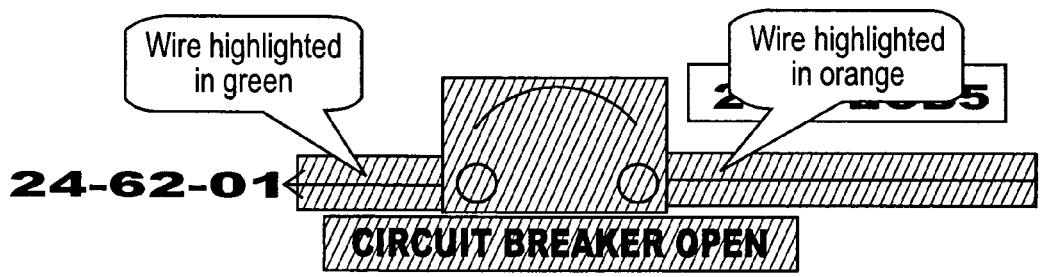
Figure 15:
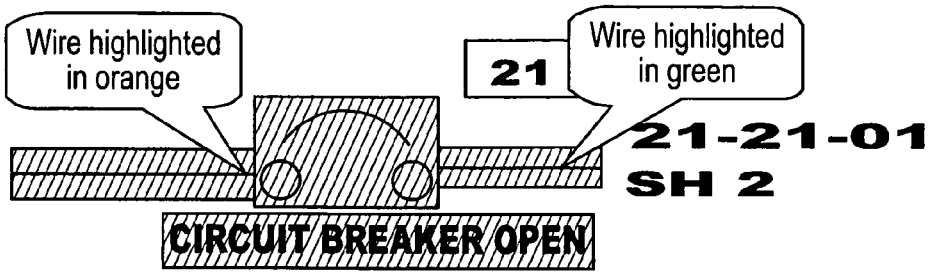

Having thus described the invention in general terms, reference will now be made to the accompanying drawings, which are not necessarily drawn to scale, and wherein:

FIG. 1 is a block diagram illustrating the operations performed by the method, computer program product, and system of one embodiment of the present invention;

FIG. 2 is a typical electronic representation of a drawing sheet (source sheet) that depicts a portion of an electrical wiring diagram having links to other drawing sheets (target sheets) in the drawing set that are electrically connected to the depicted portion according to the method, computer program product, and system of one embodiment of the present invention;

FIG. 3 is a magnified view of a portion of the source sheet of FIG. 2 depicting a circuit breaker ("2121 ECB5") with an off-sheet reference ("24-62-01");

FIG. 4 is a representative display, provided by the application system, of the intelligent graphic explorer that contains the intelligent graphic viewer display and enables the user to view, navigate among and alter the electronic representations of drawing sheets in a set depicting an electrical wiring diagram according to the method, computer program product, and system of one embodiment of the present invention;

FIG. 5 is a target sheet ("24-62-01") representing the electrical connection with the source sheet of FIGS. 2 and 3;

FIG. 6 is a magnified view of a portion of the target sheet ("24-62-01") of FIG. 5 depicting the circuit breaker ("2121 ECB5") that is automatically displayed when the off-sheet reference ("24-62-01") is selected in the source sheet of FIG. 3;

FIG. 7 is a magnified view of a portion of a source sheet illustrating the selection of the terminal ("1Y") and the automatic recognition of the off-sheet reference ("P24-62-01") as the target according to the method, computer program product, and system of one embodiment of the present invention;

FIG. 8 is a magnified view of a portion of the target sheet ("P24-62-01") depicting the terminal ("1Y") that is automatically displayed when the off-sheet reference ("P24-62-01) is selected in the source sheet of FIG. 7;

FIG. 9 is a magnified view of a portion of a source sheet illustrating a variation of the style of off-sheet reference ("See 24-20-01-01 Z D4") indicating the coordinates ("Z D4") of the target sheet ("24-20-01 SH1") to automatically display when the off-sheet reference on the source sheet is selected according to the method, computer program product, and system of one embodiment of the present invention;

FIG. 10 is a view of the portion of the target sheet ("24-20-01 SH1") designated by the coordinates ("Z D4") as selected in the source sheet of FIG. 9;

FIG. 11 is a magnified view of a portion of a source sheet indicating the splice ("SJ3 SP33B") is selected, illustrating the recognition of various element labels in source and target sheets according to the method, computer program product, and system of one embodiment of the present invention;

FIG. 12 is a magnified view of a portion of the target sheet that is automatically displayed when the off-sheet reference associated with the splice ("SJ3 SP33B") is selected in the source sheet of FIG. 11, with the splices being recognized as the same even though the label on of the splice in the target sheet ("SJ3 SP33 B") has an extra space;

FIG. 13 is a magnified view of a portion of a source sheet depicting a selected circuit breaker, illustrating how the circuit breaker is highlighted when selected, the closed state of the circuit breaker is indicated, and the wires connected to the circuit breaker are also highlighted to represent the closed state of the circuit breaker according to the method, computer program product, and system of one embodiment of the present invention;

FIG. 14 is a magnified view of a portion of the source sheet depicting the selected circuit breaker of FIG. 13, illustrating how the user can change the selected circuit breaker to the open state and the wires connected to the circuit breaker also change color to represent the open state of the circuit breaker; and FIG. 15 is a magnified view of a portion of the target sheet automatically displayed when the off-sheet reference was selected in the source sheet of FIGS. 13 and 14 depicting the circuit breaker changed to the same state in the target sheet as the circuit breaker state in the source sheet of FIG. 14.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A method, computer program product and system are therefore provided for performing automated linking between sheets of a drawing set depicting an electronic representation of an electrical wiring diagram. The method, computer program product, and system automatically transform drawings into a format that provides enriched electronic display and navigation among drawings. Connections and relationships among large sets of drawings are automatically discovered and extracted by utilizing complex graphical recognition and logical inference. Links are then created that represent the connections and relationships between common elements of the drawings. As such, the present invention automatically produces an interactive electronic representation of a drawing set that allows a user to quickly and accurately view, highlight and/or alter a portion of a drawing and all of the drawings that connect to or also depict that portion.

FIG. 1 is a block diagram illustrating the operations performed by the method, computer program product, and system 20 of one embodiment of the present invention. The legacy graphic file 22 is an electronic representation of an original drawing or set of drawings. For example, the legacy graphic file 22 may represent the complex drawings of large structures or intricate arrangements, such as electrical wiring diagrams. The drawings are commonly provided in paper/hard copy form, scanned paper images or other electronic graphic files, such as raster or vector graphic files. Before the operations depicted in FIG. 1 can commence, however, the drawings must be converted to an electronic format that allows the drawing to be interactive, such as a format that may enable functionality to be embedded in the graphic. One type of interactive format is a vector graphic format, for example a computer graphics metafile (CGM) format. The legacy drawings may be converted to an interactive format by any available method known to those skilled in the art.

Once the drawings, such as electrical wiring diagrams, are in an interactive graphic format, depicted by the legacy graphic file 22 of FIG. 1, the legacy graphic file 22 is reviewed by the reference recognizer 24. In one embodiment of the present invention, the reference recognizer 24 reviews the legacy graphic file 22 to discover and extract information contained in the drawings. The extracted information may be explicit, such as labels or text, or implicit, such as symbols or configurations. The reference recognizer 24 of the present invention may discover and extract the drawing information by matching the text, symbols and configurations of the drawing to lists containing text, symbol and configuration patterns defined by experts and end users of the type of drawings at issue. For example, in an electrical wiring diagram, the list of patterns may include predefined expressions for matching certain kinds of text, such as equipment labels, and specific graphical configurations for identifying symbols, such as switches, relays and circuit breakers. In another embodiment of the present invention, the experts and end users also may identify patterns regarding how drawings in a set are used and how the drawings are interconnected, which may include all of the possible configurations of text and/or symbols that represent off-sheet references.

The various lists of patterns may be built into the reference recognizer 24 and used to review the drawings. Generally, the lists of patterns are predefined but typically supplemented over time, particularly as different drawings with different conventions are analyzed. The reference recognizer 24 then may use proximity-based algorithms, pattern-matching techniques, and logical inference to discover the text and symbols and to identify the relationships among the drawings. Thus, even if the text and/or symbols depicted in the legacy graphic file 22 do not exactly match the text and symbol combinations in the list of patterns, the reference recognizer 24 may look to the general similarities, such as a common format, font or the like, and nonetheless be able to identify the components and text in the drawing. Further details regarding text recognition and text search within graphic files is provided in U.S. patent application No. 09/971,149 entitled The Method, Computer Program Product, and System for Performing Automated Text Recognition and Text Search Within Graphic Files, filed concurrently herewith, the contents of which are incorporated herein by reference in their entirety. The proximity-based algorithms, pattern-matching techniques, and logical inference also enable the reference recognizer 24 to identify the relationships among the drawings by associating the components and labels with the corresponding off-sheet reference, even when the off-sheet reference is located a relative distance from the components and/or text with which it is associated.

FIG. 2 is a display of a typical electronic representation of a drawing sheet that depicts a portion of an electrical wiring diagram. FIG. 3 is a magnified view of the upper left-hand corner of the portion of the electrical wiring diagram in FIG. 2. The reference recognizer 24 will determine that the depicted element is a circuit breaker since the symbol combination of two circles and an arc in FIG. 3 is the graphical configuration for a circuit breaker 44 as defined by the list described above. The reference recognizer 24 will also interpret the two lines extending outward from circuit breaker 44 to be the graphical configuration representing the wires 48 connected to circuit breaker 44. Moreover, the reference recognizer 24 will discern the circuit breaker reference designator 46 to be the text element "2121ECB5" and the off-sheet reference 42 to be the text element "24-62-01," based upon the predefined format for these elements established by the lists. Below is an example the legacy graphic file 22 in CGM format for the symbols and text of FIG. 3:

```
Circle 3665 692 9;
    :
Circle 3742 692 9;
    :
ArcCtr 3704 625 86 38 77 39 77;
    :
Text 3770 735 final "2121ECB5";
    :
Text 3505 735 final "24-62-01";
``` wherein the "Circle" and "ArcCtr" fields designate the geometric positions of the circle and arc symbols in the graphical configuration for circuit breaker 44. Likewise, the "Text" fields designate the geometric positions of the reference designator 46, "2121ECB5," and the off-sheet reference 42, "24-62-01."

Thus, in one embodiment of the present invention, the lists associated with the reference recognizer 24 for an electrical wiring diagram may include the patterns of symbols and text described above. The reference recognizer 24 also may infer patterns by examining the internal geometric representations of each element in the legacy graphic file 22. For example, the reference recognizer 24 may review the drawing sheet in FIG. 2, as a legacy graphic file 22, to identify the location on the drawing of the symbols and text. The reference recognizer 24 then may utilize the lists of patterns to match the identified symbols and text to the expert and end user defined text and symbol configurations and to identify the components of the drawing. Thus, in FIG. 3, the reference recognizer 24 may identify the circuit breaker 44, the wires 48, the circuit breaker reference designator 46, and the off-sheet reference 42 by matching the symbols and text to the patterns defined in the lists built into the reference recognizer 24.

If the symbols and text do not exactly match the patterns in the list, the reference recognizer 24 may use proximity-based algorithms and/or logical inference to nevertheless identify the components of the drawing. For example, the lists associated with the reference recognizer 24 may not explicitly list every reference designator associated with the circuit elements. However, the lists may define the general format of the reference designators, such as a string composed of at least one number, followed by at least one letter, followed in turn by at least one number. The reference recognizer 24 may therefore automatically identify the circuit breaker reference designator 46 due to the proximity of the reference designator 46 to the circuit breaker 44, i.e., within a predefined region surrounding the circuit breaker 44, and further due to the format of the reference designator 46 matching the predefined format for reference designators. The reference recognizer 24 also may identify the off-sheet reference 42 as being associated with the circuit breaker 44, wires 48, and reference designator 46 by using proximity-based algorithms and/or logical inference. Similarly, the lists may define the general format of off-sheet references, such as a string composed of segments of at least one number and/or at least one letter and the segments separated by at least one hyphen. The reference recognizer 24 may therefore automatically identify the circuit breaker off-sheet reference 42 due to the proximity of the off-sheet reference 42 to the circuit breaker 44, i.e., within a predefined region surrounding the circuit breaker 44, and further due to the format of the off-sheet reference 42 matching the predefined format for off-sheet references. While examples of the proximity-based and inferential reasoning provided by the reference recognizer 24 are provided above, the reference recognizer 24 may utilize other proximity-based and inferential reasoning techniques, if so desired. Regardless of the particular recognition technique, the reference recognizer 24 of this example creates a "packet" of information that contains the components 40 represented in FIG. 3 and indicates that the components 40 are related.

Once the reference recognizer 24 identifies all the components of a legacy graphic file 22 and creates packets of information containing the related components, the reference object generator 26 may create a reference object file 28. The reference object file 28 contains all the reference designators, off-sheet references, elements, components, and packets of information identified by the reference recognizer 24 and the features added by the reference object generator 26, as described below. The reference object generator 26 may create one reference object file 28 for each original drawing sheet, although the reference object file 28 may dissect or combine the original drawing sheets in other ways, if desired. The format of the reference object file 28 may be any computer readable format, for example a markup format, such as extensible markup language (XML) format.

In one embodiment of the present invention, the reference object generator 26 reviews all of the information supplied by the reference recognizer 24 and identifies additional features of the elements. For example, the reference object generator 26 may identify the "state" of the element, if applicable. For the set of components 40 in FIG. 3, the reference object generator 26 may identify the circuit breaker 44 and further identify the "state" of the circuit breaker 44. The reference object generator 26 may identify the state of the circuit breaker 44 by the location of the symbols that comprise the graphical representation of the circuit breaker. For example, if the circuit breaker is closed, the arc may connect the two circles in the circuit breaker graphical representation and, if the circuit breaker is open, the arc may be separated by a distance from the two circles. The reference object generator 26 then may record the initial state of the circuit breaker 44 as "closed" or "open" to include in the reference object file 28 with the associated circuit breaker reference designator 46. The element state and reference designator recorded in the reference object file 28 provide the information that may be used later in the operations of one embodiment of the present invention to change the component state, navigate among drawings depicting the component, and ensure the component state is the same in all of the drawings. The reference object generator 26 also may add instructions into the reference object file 28 regarding changing the graphical representation of a circuit element, such as the circuit breaker, when the state of the circuit element is changed from its initial state and afterward. Changing the graphical representation of the circuit breaker from its initial state, for instance, includes changing the color and location of the arc part of the symbol. The instructions added to the reference object file 28 by the reference object generator 26 also may include text indicating the state of the circuit breaker that may appear near the circuit breaker when the circuit breaker is selected.

In another embodiment of the method, computer program product, and system 20 of the present invention, identifying the state information of one element may provide state information regarding related or connected elements or components. For instance, regarding the set of components in FIG. 3, when the state of the circuit breaker 44 is open, the wires 48 on either side of the circuit breaker 44 are not electrically connected. When the state of the circuit breaker 44 is closed, however, the wires 48 on either side of the circuit breaker 44 are electrically connected. As such, the reference object generator 26 may also record the electrical state of the wires to include in the reference object file 28 with the associated reference designator 46. The reference object generator 26 may also add instructions into the reference object file 28 regarding changing the highlight color of the wires 48 depending on whether the wires are electrically connected or not. Below is an example of a portion of an XML reference object file for the circuit breaker 44 and related components of FIG. 3:

```
<object id="EC387" hslistid="HS387
    role="ECOMP" name="CIRCUITBREAKER"
    refdes="2121ECB5" states="S387-CLOSED S387-OPEN"
    init_state="S387-CLOSED"></object>
<object id="S387-CLOSED" role="EC_STATE"
    connect="N19 N138"
    magtext="CIRCUIT BREAKER CLOSED"></object>
<object id="S387-OPEN" role="EC_STATE"
    draw="IntStyle empty; EdgeWidth 12;
        ArcCtr -10874 7963 157 185 -159 185 240;"
    erase="IntStyle solid; EdgeWidth 12;
        ArcCtr -10874 7843 157 185 -159 185 240;"
    magtext="CIRCUIT BREAKER OPEN"></object>
``` wherein "object id="EC387"" identifies an object for the circuit breaker that contains its reference designator "refdes="2121ECB5"" and its simulation states "states="S387-CLOSED S387-OPEN"" and "init_state="S387-CLOSED"" indicates the initial state of the circuit breaker is closed. Furthermore, "object id="S387-CLOSED"" identifies an object for the circuit breaker in the initial closed state that contains directions, "connect="N19 N138"," to depict the two wires as electrically connected. Similarly, "object id="S387-OPEN"" identifies an object for the circuit breaker in the changed open state that contains directions to erase the initial arc and draw a new arc to indicate that the circuit breaker is open and that the electrical connection is broken "draw=" . . . ;"" and "erase=" . . . ;". " In this example, the draw and erase attributes are contained in the object for the open state only because erasing and drawing is only necessary if the circuit breaker is changed to the open state from its initial closed state.

A further embodiment of the method, computer program product, and system 20 of the present invention provides that the reference object generator 26 supplies instructions to include in the reference object file 28 that create "hotspots" for particular elements or groups of components. A hotspot defines an area of the diagram or an element in the diagram that is visually emphasized when a selection device, such as a mouse, brushes over the element or area. For example, to create a hotspot for the circuit breaker 44 in FIG. 3, the reference object generator 26 may identify a rectangular highlighted region over the circuit breaker 44 and the text to display near the circuit breaker 44 describing the current state of the circuit breaker. The reference object generator 26 then includes the hotspot instructions in the reference object file 28 to define the bounds of the hotspot and the manner in which the hotspot is to be depicted, such as by being highlighted or the like. Recording the hotspot instructions in the reference object file 28 provides the information that may be used later in the operations of one embodiment of the present invention to display a highlighted region around the circuit breaker along with text near the circuit breaker indicating the current state of the circuit breaker each time a selection device, such as a mouse, brushes over circuit breaker 44. Further explanation of at least some of the foregoing features of the method, computer program product, and system 20 of the present invention described above may be found in U.S. patent application Ser. No. 09/615,499, entitled Intelligent Wiring Diagram System, filed on Jul. 13, 2000, the contents of which are incorporated herein by reference in their entirety.

One advantageous embodiment of the method, computer program product, and system 20 of the present invention provides that the graphic builder 30 depicted in FIG. 1 merge the information from the reference object file 28 and the legacy graphic file 22 to form an intelligent graphic file 32. The format of the intelligent graphic file 32 may be an electronic format that allows the drawing to be interactive, such that data from the reference object file 28 may be embedded in the legacy graphic file 22, for example a computer graphics metafile (CGM) format. To embed data from the reference object file 28 in the legacy graphic file 22, the intelligent graphic file 32 may contain application program structures to "hide" the data from the reference object file 28 in the graphic file. Typically, hundreds of application program structures may exist in an intelligent graphic file 32 for a single drawing, one of which is associated with each embedded data element from the reference object file 28. For a particularly complex drawing, more than one thousand application program structures may exist in an intelligent graphic file 32.

One type of application program structure (APS) is a hotspot APS, which may be used for any elements in the drawing that are selectable, such as circuit breakers and off-sheet references. In accordance with one embodiment of the present invention, the hotspot APS for an off-sheet reference may contain a data field with the information that enables linking to the target drawing and automatic panning and zooming features. The hotspot APS also may contain another type of APS that defines the region surrounding the selectable object. For the off-sheet reference described above, this APS may define the rectangular region around the off-sheet reference that highlights the off-sheet reference and provides magnified text upon selection. With respect to the circuit breaker 44 example of FIG. 3, the APS within the hotspot APS may track the changes in the circuit breaker's state and define the rectangular highlighted region over the circuit breaker and the text that may appear when the selection device, such as a mouse, brushes over the circuit breaker 44. A further type of APS is a layer APS, which may provide the information needed to simulate the electrical component states. The layer application program structure may contain the elements that may be used to change the graphical representation of the circuit breaker when the state of the circuit breaker is changed from its initial state to another state. Changing the graphical representation of the circuit breaker from closed to open, for instance, may include erasing the arc that connects the circles in the symbol for the circuit breaker, redrawing the arc at a distance above the circles, and changing the color of the arc.

As described above, the application program structures of the intelligent graphic file 32 may enable automatic linking between sheets of a drawing set in one embodiment of the method, computer program product, and system 20 of the present invention. In this regard, a user may view a drawing sheet (a source sheet) and may select a link to another drawing sheet (a target sheet). The method, computer program product, and system of the present invention then provide for the target sheet to be automatically displayed in a manner described below. The viewing of and navigation about a drawing sheet and the selection of various off-sheet references are generally provided by an intelligent graphics viewer 36. The intelligent graphics viewer 36 may be part of the application system 34, depicted in FIG. 1. The intelligent graphics viewer 36 includes the user interface that allows a user to interact with the display by moving a cursor, via a selection device, such as a mouse, to indicate for example, electrical connections between respective portions of the electrical wiring diagram, selection of links, setting a state of an element in the electrical wiring diagram, and highlighting selected elements of the electrical wiring diagram.

The application system 34 also may contain databases with all of the information about the drawing set, for example the databases may contain information regarding the parts depicted in the wiring diagram such that a user viewing the graphical representation of the wiring diagram may also access textual information regarding the parts depicted in the wiring diagram. In addition, the application system 34 may provide the ability to display intelligent graphic files depicting the different configurations of the parts contained in the wiring diagram intelligent graphic file, such as intelligent graphic files of parts catalogs or maintenance manuals. For example, the application system 34 may enable selection of a part in the wiring diagram and subsequent, automatic display of the same part depicted in a parts catalog along with textual information regarding the part that is extracted from the database. Further details regarding including associated parts information in the display is provided in U.S. patent application Ser. No. 09/971,155 entitled The Method, Computer Program Product, and System for Creating and Viewing an Intelligent Graphics File Including Parts Information, filed concurrently herewith, the contents of which are incorporated herein by reference in their entirety.

Furthermore, the application system 34 may provide the user with the ability to turn on or off any of the automated features such that the user may customize the intelligent graphic automated linking system 20 at any time while using the system 20. FIG. 4 is a representative display provided by the application system 34. The application system 34 may provide an intelligent graphic explorer 50 that may embody the intelligent graphics viewer display 60, which is part of the intelligent graphics viewer 36, according to the method, computer program product, and system 20 of one embodiment of the present invention. The intelligent graphic explorer 50 of FIG. 4 may enable the user to view, navigate among and alter the electronic representations of drawing sheets in a set depicting an electrical wiring diagram.

The intelligent graphic explorer 50 may present a display that may be configured in any form. For example, in FIG. 4, the intelligent graphic explorer 50 is configured so that the top section of the display may depict the system and drawing information 52 that may be provided by databases in the application system 34. The section on the left of the display may show the table of contents 54 and the search function 56 for the drawing sets or other information that may be provided by databases in the application system 34. The section at the bottom of the display may present a scrollable and searchable portion 58 of a database, such as a parts and/or maintenance manual associated with the drawing on display, as described above. The intelligent graphics viewer display 60, which is part of the intelligent graphic viewer 36, embedded within the intelligent graphic explorer 50 creates the portion of the display shown in FIG. 4 to be located to the right of the table of contents 54 and, in this example, is displaying the same source sheet as is depicted in FIG. 2.

The intelligent graphic explorer 50 depicted in FIG. 4 may provide the interface for the functionality provided by the application system 34 and the intelligent graphic viewer 36. For example, the intelligent graphics viewer 36 may permit a user to view the source sheet depicted in FIG. 2 based on the electronic representation of the source sheet, stored by the intelligent graphic file 32, and to choose to magnify a portion of the drawing sheet showing a particular element by selecting that element, which is a circuit breaker in this example. The intelligent graphics viewer 36 may automatically present the magnified view of the circuit breaker 44 and the associated components as shown in FIG. 3. In addition, the intelligent graphics explorer 50 may show parts information for the components displayed by the intelligent graphics viewer 36. The user then may select the off-sheet reference 42 (24-62-01) and the application program structures containing the data and functions associated with that off-sheet reference may be automatically retrieved from the intelligent graphic file 32. The intelligent graphics viewer 36 may automatically find and display the target sheet (24-62-01), depicted in FIG. 5. The intelligent graphics viewer 36 also may automatically display the target sheet with the magnified view of circuit breaker 44 (2121ECB5), which is common to the source and target sheets, as depicted in FIG. 6.

FIGS. 7 through 15 further illustrate the features of the method, computer program product, and system 20 of various embodiments of the present invention. In all of the examples to follow, the figures are representative of the magnified views that a user may observe via the intelligent graphic viewer 36.

FIGS. 7 and 8 demonstrate the manner in which the method, computer program product, and system 20 of one embodiment of the present invention is able to link to the appropriate off-sheet reference even when the off-sheet reference is not directly next to the selected element. FIG. 7 is a magnified view of a portion of a source sheet illustrating the selection of the terminal ("1Y") and the highlighted wires connected to selected terminal 1Y. When reviewing the source sheet at issue during the initial process of generating first, the reference object file then, the intelligent graphic file, the method, computer program product, and system 20 of one embodiment of the present invention automatically recognized the off-sheet reference ("P24-62-01") as the target sheet for the terminal 1Y. The off-sheet reference ("P24-62-01") is recognized as the target sheet for the terminal 1Y due to the proximity of the off-sheet reference to terminal 1Y and the format of the off-sheet reference. The method, computer program product, and system 20 also recorded the off-sheet reference ("P24-62-01") as the target sheet for terminal 1Y in the application program structures. Therefore, when the user selects terminal 1Y and the off-sheet reference ("P24-62-01 ") in the source sheet, the magnified view of a portion of the target sheet ("P24-62-01") depicting terminal 1Y is automatically displayed, as FIG. 8 shows. FIG. 8 also illustrates that the selected element, terminal 1Y, is depicted in the same manner in the target sheet as it was in the source sheet, i.e., terminal 1Y selected and the wires connected to terminal 1Y highlighted. Automatically recognizing the link to the appropriate off-sheet reference even when the off-sheet reference is not directly next to the selected element saves time and money for system builders who otherwise would have determine and manually enter all the links to other drawing sheets into each drawing sheet. Additionally, automatically displaying the magnified view of the portion of the target sheet depicting the same element in the same manner as in the source sheet saves time and money for users who otherwise would have to manually search the drawing set to find the target sheet then search the target sheet to find the correction portion.

FIGS. 9 and 10 demonstrate the manner in which the method, computer program product, and system 20 of one embodiment of the present invention is able to link to the appropriate off-sheet reference even when the style of the off-sheet reference is unusual. FIG. 9 is a magnified view of a portion of a source sheet illustrating a wire ("SP0011") that has been selected and highlighted, and a variation of the style of off-sheet reference ("See 24-20-01-01 Z D4"). When reviewing the source sheet at issue, the method, computer program product, and system 20 of the present invention automatically recognized ("See 24-20-01-01 Z D4") as the off-sheet reference and that ("Z D4") indicate the coordinates of the target sheet ("24-20-01 SH1") associated with the wire ("SP011"). This off-sheet reference recognition is due to the variations of reference designator formats included on the list and the variations of those predefined formats that are permitted, such as by permitting the reference designator to be preceded by "See." The method, computer program product, and system 20 also recorded the off-sheet reference for wire ("SP001") as the portion of the target sheet ("24-20-01 SH1") having the coordinates ("Z D4") in the application program structures. Therefore, when the user selects wire ("SP0011 ") and the off-sheet reference ("See 24-20-01-01 Z D4") in the source sheet, the magnified view of a portion of the target sheet ("24-20-01 SH1") within the coordinates ("Z D4") is automatically displayed, as FIG. 10 shows. FIG. 10 also illustrates that because the authors of the drawings failed to label which of the two wires in the target sheet correspond to wire ("SP0011 ") on the source sheet, and even an expert cannot determine which wire to highlight, neither wire in the target sheet is highlighted.

FIGS. 11 and 12 next demonstrate the manner in which the method, computer program product, and system 20 of one embodiment of the present invention is able to link to the appropriate element in the target sheet even though the labels of the element differ in the source and target sheets. FIG. 11 is a magnified view of a portion of a source sheet indicating the splice ("SJ3 SP33B") is selected by highlighting the wire. When reviewing the source sheet at issue, the method, computer program product, and system 20 of the present invention automatically recognized the off-sheet reference as the target sheet for the splice ("SJ3 SP33B") and searched the target sheet for the splice ("SJ3 SP33B"). The method, computer program product, and system 20 of the present invention then automatically recognized, and recorded in the application program structures, that the splice ("SJ3 SP33 B") in the target sheet is the same as the splice ("SJ3 SP33B") in the source sheet even though the spacing within the label differs. This recognition that the splices in the target and source sheets are the same occurs because the reference recognizer 24 is preferably designed to permit slight variances, such as variations in spacing, punctuation, font, and the like. Therefore, when the user selects the splice ("SJ3 SP33B") and the off-sheet reference in the source sheet, the magnified view of a portion of the target sheet depicting the splice ("SJ3 SP33B") is automatically displayed, as FIG. 12 shows. FIG. 12 also illustrates that the selected splice is depicted in the same manner in the target sheet as it was in the source sheet, i.e., the wires representing the splice are highlighted.

The manner in which the method, computer program product, and system 20 of one embodiment of the present invention enables the user, through the intelligent graphic viewer 36, to change the state of an element in a source sheet and display the element in the same state in the target sheet is illustrated by FIGS. 13 through 15. As described above, when the reference object generator 26 supplied instructions regarding features of particular elements identified by the reference recognizer 24, the features were recorded in the application program structures embedded in the intelligent graphic file 32. The features of a circuit breaker element, for example, are then automatically displayed when the circuit breaker is selected. FIG. 13 is a magnified view of a portion of a source sheet depicting a selected circuit breaker. When the user selects the circuit breaker in FIG. 13, the rectangular area around the circuit breaker is highlighted, text indicating the closed state of the circuit breaker appears, and the wires connected to the circuit breaker are highlighted in the same color to represent the wires are electrically connected due to the closed state of the circuit breaker.

The method, computer program product, and system 20 of one embodiment of the present invention also may enable the user to "click" with a selection device, such as a mouse, on the top of the circuit breaker component to change the circuit breaker state from closed to open. When the user changes the state of the circuit breaker, the application program structures may automatically change the location of the arc in the symbol for the circuit breaker, change the text to indicate the open state, and change the highlight of the wires to represent that the wires are not electrically connected due to the open state of the circuit breaker. The magnified view of a portion of the source sheet depicting the selected circuit breaker in the open state is shown in FIG. 14.

Furthermore, the method, computer program product, and system 20 of one embodiment of the present invention provide that when the off-sheet reference for the circuit breaker with a changed state is selected from the source drawing, the target drawing is automatically magnified to the matching circuit breaker. The application program structures define that the circuit breaker on the target sheet is preferably automatically updated by the application system 34 and/or the graphic builder 30 upon changing the circuit breaker in the source sheet. Therefore, upon display of the target sheet, the circuit breaker will have the same state as the circuit breaker on the source sheet and the wires in the target sheet are highlighted in the same colors as in the same wires in the source sheet. FIG. 15 is a magnified view of the portion of the target sheet that may be automatically displayed when the off-sheet reference is selected in the source sheet of FIGS. 13 and 14. FIG. 15 shows that the circuit breaker on the target sheet is changed to the same state and the wires highlighted in the same colors as in the source sheet of FIG. 14.

The system 20 of the present invention and, in particular, the reference recognizer 24, the reference object generator 26, the graphic builder 30, the application system 34, and the intelligent graphics viewer 36, are typically embodied by a processing element and an associated memory device, both of which are commonly comprised by a computer or the like. As such, the system of the present invention generally operates under control of a computer program product to provide the functionality described hereinabove in conjunction with the various components of the system, according to another aspect of the present invention. The computer program product for performing the contingent claim valuation includes a computer-readable storage medium, such as the non-volatile storage medium, and computer-readable program code portions, such as a series of computer instructions, embodied in the computer-readable storage medium.

In this regard, FIG. 1 is a block diagram and flowcharts of methods, systems and program products according to the invention. It will be understood that each block or step of the flowchart, and combinations of blocks in the flowchart, can be implemented by computer program instructions. These computer program instructions may be loaded onto a computer or other programmable apparatus to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that each block or step of the flowchart, and combinations of blocks or steps in the flowchart, can be implemented by special purpose hardware-based computer systems which perform the specified functions or steps, or combinations of special purpose hardware and computer instructions.

Thus, the intelligent automated graphic linking method, computer program product, and system 20 of the present invention provide for automatically creating links among large sets of drawing sheets that provide an electronic representation of an electrical wiring diagram. The links indicate that the respective portions of the electrical wiring diagram depicted by the source and target sheets are electrically connected and provide the user with navigation among the drawings by selecting links. The present invention may also provide for setting the state of or highlighting an element of the electrical diagram in a source sheet and automatically changing the state of or highlighting that element in all the target sheets that depict that element. All of the features of the various embodiments of the present invention provide users and electronic graphic system builders with intelligent graphic automated linking that completely avoids the time-consuming and expensive steps of the other approaches and, instead, provides all efficient and accurate approach to searching large drawing sets.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of linking a plurality of pre-existing sheets of a drawing set depicting a diagram comprising:
    providing an electronic representation of the plurality of sheets of the drawing set depicting the diagram;
    automatically reviewing a source sheet selected from the plurality of sheets of the drawing set depicting the diagram, wherein automatically reviewing the source sheet comprises automatically recognizing an off-sheet reference depicted in the source sheet indicative of a continuation of a portion of the diagram depicted by the source sheet upon a target sheet, and wherein automatically recognizing an off-sheet reference comprises automatically recognizing the off-sheet reference by automatically identifying at least one symbol representative of the off-sheet reference; and
    automatically creating a selectable electronic link associated with the electronic representation of the source and target sheets that indicates that the respective portions of the diagram depicted by the source and target sheets are operably connected and that is configured to cause a display of the other of the source and target sheets upon selection, wherein automatically creating the selectable electronic link comprises automatically creating the selectable electronic link based on automatically reviewing the source sheet and automatically recognizing the off-sheet reference and without manual entry of the link.

2. A method according to claim 1, further comprising providing a list of at least one symbol representative of off-sheet references.

3. A method according to claim 2, wherein identifying at least one symbol representative of the off-sheet reference comprises identifying the target sheet based upon the symbol.

4. A method according to claim 1, further comprising providing an electronic representation of graphics and text of a parts catalog, wherein automatically reviewing the source sheet also comprises automatically recognizing an off-sheet reference associated with a part depicted in the source sheet indicative of the same part within the electronic representation of the parts catalog, and wherein the link depicted by the source sheet upon a target sheet associated with the electronic representation of the source and target sheets indicates that the part depicted in the source sheet is the same part depicted in the target sheet.

5. A computer program product for linking a plurality of pre-existing sheets of a drawing set depicting a diagram, the computer program product comprising a computer-readable storage medium having computer-readable program code portions stored therein, the computer-readable program code portions comprising:
    a first executable portion capable of providing an electronic representation of the plurality of sheets of the drawing set depicting the diagram;
    a second executable portion capable of automatically reviewing a source sheet selected from the plurality of sheets of the drawing set depicting the diagram, wherein said second executable portion is also capable of automatically recognizing an off-sheet reference depicted in the source sheet indicative of a continuation of a portion of the diagram depicted by the source sheet upon a target sheet, and wherein said second executable portion is further capable of automatically recognizing the off-sheet reference by automatically identifying at least one symbol representative of the off-sheet reference; and a third executable portion capable of automatically creating a selectable electronic link associated with the electronic representation of the source and target sheets that indicates that the respective portions of the diagram depicted by the source and target sheets are operably connected and that is configured to cause a display of the other of the source and target sheets upon selection, wherein the third executable portion is configured to automatically create the selectable electronic link based on automatically reviewing the source sheet and automatically recognizing the off-sheet reference and without manual entry of the link.

6. A computer program product according to claim 5, further comprising a fourth executable portion capable of providing a list of at least one symbol representative of off-sheet references.

7. A computer program product according to claim 6, wherein said second executable portion is further capable of identifying the target sheet based upon the symbol.

8. A computer program product according to claim 5, further comprising a fourth executable portion capable of providing an electronic representation of graphics and text of a parts catalog, wherein said second executable portion is further capable of automatically recognizing an off-sheet reference associated with a part depicted in the source sheet indicative of the same part within the electronic representation of the parts catalog depicted by the source sheet upon a target sheet, and wherein said third executable portion is also capable of creating a link associated with the electronic representation of the source and target sheets that indicates that the part depicted in the source sheet is the same part depicted in the target sheet.

9. A system for linking a plurality of pre-existing sheets of a drawing set depicting a diagram, the system comprising:
a memory device for storing an electronic representation of the plurality of sheets of the drawing set depicting the diagram; and
a processing element capable of automatically reviewing a source sheet selected from the plurality of sheets of the drawing set depicting the diagram, said processing element also capable of automatically recognizing an off-sheet reference depicted in the source sheet indicative of a continuation of the a portion of the diagram depicted by the source sheet upon a target sheet by automatically identifying at least one symbol representative of the off-sheet reference, said processing element further capable of automatically creating a selectable electronic link associated with the electronic representation of the source and target sheets that indicates that the respective portions of the diagram depicted by the source and target sheets are operably connected and that is configured to cause a display of the other of the source and target sheets upon selection, wherein said processing element is configured to automatically create the selectable electronic link based on automatically reviewing the source sheet and automatically recognizing the off-sheet reference and without manual entry of the link.

10. A system according to claim 9, wherein said memory device also stores a list of at least one symbol representative of off-sheet references.

11. A system according to claim 10, wherein said processing element is further capable of identifying the target sheet based upon the symbol.

12. A system according to claim 9, wherein said memory device also stores an electronic representation of graphics and text of a parts catalog, wherein said processing element is further capable of automatically recognizing an off-sheet reference associated with a part depicted in the source sheet indicative of the same part within the electronic representation of the parts catalog depicted by the source sheet upon a target sheet, and wherein said processing element is further capable of creating a link associated with the electronic representation of the source and target sheets that indicates that the part depicted in the source sheet is the same part depicted in the target sheet.

13. A method of viewing an electronic representation of a diagram depicted by a drawing set having a plurality of sheets comprising:
providing the electronic representation of the diagram depicted by the drawing set, wherein providing the electronic representation of the diagram comprises providing a plurality of electronic links that indicate that respective portions of the diagram depicted by at least two sheets are operably connected;
selecting an electronic link on a source sheet chosen from the plurality of sheets depicting the diagram; and
automatically displaying at least a segment of a target sheet that is associated with the source sheet by the link, wherein automatically displaying at least a segment of the target sheet comprises representing circuit elements that are common to both the source and target sheets and represented in any one of a plurality of different operational states in a manner in the target sheet that is dependent upon the operational state in which the same circuit element is depicted in the source sheet.

14. A method according to claim 13, further comprising setting a state of an element of the diagram in a display of the source sheet, wherein the element is associated with the selected link and is common to both the source and target sheet, and wherein automatically displaying at least a segment of the target sheet further comprises depicting the element in the same state in the target sheet.

15. A method according to claim 13, further comprising highlighting a selected element of the diagram in a display of the source sheet, wherein the selected element is associated with the selected link and is common to both the source and target sheet, and wherein automatically displaying at least a segment of the target sheet further comprises similarly highlighting the selected element depicted by the target sheet.

16. A method according to claim 13, further comprising automatically identifying the target sheet based on the selection of the link.

17. A method according to claim 13, wherein automatically displaying at least a segment of the target sheet further comprises automatically displaying a magnified view of a part of the diagram having elements associated with the link that are common to both the source and target sheets.

18. A method according to claim 13, further comprising providing an electronic representation of graphics and text of a parts catalog, and wherein providing the electronic representation of the diagram comprises providing a plurality of links that indicate that respective portions of the diagram and the parts catalog depict the same part.

19. A computer program product for viewing an electronic representation of a diagram depicted by a drawing set having a plurality of sheets, the computer program product comprising a computer-readable storage medium having computer-readable program code portions stored therein, the computer-readable program code portions comprising:
a first executable portion capable of providing the electronic representation of the diagram depicted by the drawing set, wherein said first executable portion is also capable of providing a plurality of electronic links that indicate that respective portions of the electrical wiring diagram depicted by at least two sheets are operably connected;

a second executable portion capable of selecting an electronic link on a source sheet chosen from the plurality of sheets depicting the diagram; and a third executable portion capable of automatically displaying at least a segment of a target sheet that is associated with the source sheet by the link, wherein said third executable portion is also capable of representing circuit elements that are common to both the source and target sheets and represented in any one of a plurality of different operational states in a manner in the target sheet that is dependent upon the operational state in which the same circuit element is depicted in the source sheet.

20. A computer program product according to claim 19, further comprising a fourth executable portion capable of setting a state of an element of the diagram in a display of the source sheet, wherein the element is associated with the selected link and is common to both the source and target sheet, and wherein said third executable portion is further capable of depicting the element in the same state in the target sheet.

21. A computer program product according to claim 19, further comprising a fourth executable portion capable of highlighting a selected element of the diagram in a display of the source sheet, wherein the selected element is associated with the selected link and is common to both the source and target sheet, and wherein said third executable portion is further capable of similarly highlighting the selected element depicted by the target sheet.

22. A computer program product according to claim 19, further comprising a fourth executable portion capable of automatically identifying the target sheet based on the selection of the link.

23. A computer program product according to claim 19, wherein said third executable portion is further capable of automatically displaying a magnified view of a part of the diagram having elements associated with the link that are common to both the source and target sheets.

24. A computer program product according to claim 19, further comprising a fourth executable portion capable of providing an electronic representation of graphics and text of a parts catalog, and wherein said first executable portion is further capable of providing a plurality of links that indicate that respective portions of the diagram and the parts catalog depict the same part.

25. A system for viewing an electronic representation of a diagram depicted by a drawing set having a plurality of sheets, the system comprising:

a memory device for storing the electronic representation of the diagram depicted by the drawing set, said memory device also for storing a plurality of electronic links that indicate that respective portions of the electrical wiring diagram depicted by at least two sheets are operably connected;

a user interface capable of indicating that respective portions of the diagram depicted by at least two sheets are operably connected, said user interface also capable of indicating that an electronic link on a source sheet chosen from the plurality of sheets depicting the diagram is selected; and a processing element responsive to selecting the link on the source sheet chosen from the plurality of sheets depicting the diagram, said processing element capable of automatically displaying at least the segment of the target sheet that is associated with the source sheet by the link, said processing element further capable of representing circuit elements that are common to both the source and target sheets and represented in any one of a plurality of different operational states in a manner in the target sheet that is dependent upon the operational state in which the same circuit element is depicted in the source sheet.

26. A system according to claim 25, wherein said user interface is further capable of indicating setting a state of an element of the diagram in a display of the source sheet, wherein the element is associated with the selected link and is common to both the source and target sheet, wherein said processing element is further responsive to setting the state of the element, and wherein said processing element is further capable of depicting the element in the same state in the target sheet.

27. A system according to claim 25, wherein said user interface is further capable of indicating highlighting a selected element of the diagram in a display of the source sheet, wherein the element is associated with the selected link and is common to both the source and target sheet, wherein said processing element is further responsive to highlighting a selected element, and wherein said processing element is further capable of similarly highlighting the selected element depicted by the target sheet.

28. A system according to claim 25, wherein said processing element is further capable of automatically identifying the target sheet based on the selection of the link.

29. A system according to claim 25, wherein said processing element is further capable of automatically displaying a magnified view of a part of the diagram having elements associated with the link that are common to both the source and target sheets.

30. A system according to claim 25, wherein said memory device also stores an electronic representation of graphics and text of a parts catalog, and wherein said memory device further stores a plurality of links that indicate that respective portions of the diagram and the parts catalog depict the same part.

31. The method of linking the plurality of sheets of the drawing set depicting the diagram according to claim 1, wherein the diagram is an electrical wiring diagram.

32. The computer program product for linking the plurality of sheets of the drawing set depicting the diagram according to claim 5, wherein the diagram is an electrical wiring diagram.

33. The system for linking the plurality of sheets of the drawing set depicting the diagram according to claim 9, wherein the diagram is an electrical wiring diagram.

34. The method of viewing the electronic representation of the diagram depicted by the drawing set having the plurality of sheets according to claim 13, wherein the diagram is an electrical wiring diagram.

35. The computer program product for viewing the electronic representation of the diagram depicted by the drawing set having the plurality of sheets according to claim 19, wherein the diagram is an electrical wiring diagram.

36. The system for viewing the electronic representation of the diagram depicted by the drawing set having the plurality of sheets according to claim 25, wherein the diagram is an electrical wiring diagram.

* * * * *